United States Patent
Koury, Jr.

(10) Patent No.: US 8,710,597 B1
(45) Date of Patent: Apr. 29, 2014

(54) METHOD AND STRUCTURE FOR ADDING MASS WITH STRESS ISOLATION TO MEMS STRUCTURES

(75) Inventor: Daniel N. Koury, Jr., Mesa, AZ (US)

(73) Assignee: mCube Inc., San Jose, CA (US)

( * ) Notice: Subject to any disclaimer, the term of this patent is extended or adjusted under 35 U.S.C. 154(b) by 167 days.

(21) Appl. No.: 13/090,228

(22) Filed: Apr. 19, 2011

Related U.S. Application Data

(60) Provisional application No. 61/326,591, filed on Apr. 21, 2010.

(51) Int. Cl.
    *H01L 29/84* (2006.01)
(52) U.S. Cl.
    USPC ........... 257/414; 257/252; 257/254; 257/419; 257/E21.002; 438/48; 438/49; 73/514.32; 73/504.03
(58) Field of Classification Search
    USPC ............... 257/414, 252, 254, 419; 73/514.32; 73/504.03; 438/48, 49
    See application file for complete search history.

(56) References Cited

U.S. PATENT DOCUMENTS

| | | | |
|---|---|---|---|
| 5,392,650 A * | 2/1995 | O'Brien et al. ............ | 73/514.18 |
| 6,188,322 B1 | 2/2001 | Yao et al. | |
| 6,196,067 B1 * | 3/2001 | Martin et al. .............. | 73/514.32 |
| 6,635,509 B1 * | 10/2003 | Ouellet ........................ | 438/106 |
| 6,936,491 B2 * | 8/2005 | Partridge et al. ................ | 438/48 |
| 6,939,473 B2 * | 9/2005 | Nasiri et al. ....................... | 216/2 |
| 6,979,872 B2 | 12/2005 | Borwick et al. | |
| 7,442,570 B2 * | 10/2008 | Nasiri et al. .................... | 438/48 |
| 2004/0016995 A1 | 1/2004 | Kuo et al. | |
| 2004/0227201 A1 | 11/2004 | Borwick, III et al. | |
| 2005/0252293 A1 | 11/2005 | Won et al. | |
| 2006/0208326 A1 * | 9/2006 | Nasiri et al. .................. | 257/414 |
| 2008/0014682 A1 | 1/2008 | Yang et al. | |
| 2011/0265574 A1 | 11/2011 | Yang | |

OTHER PUBLICATIONS

Office Action for U.S. Appl. No. 12/945,087, mailed on Mar. 19, 2012, 6 pages.
International Search Report and Written Opinion of PCT Application No. PCT/US10/054567, mailed on Jan. 6, 2011, 7 pages total.

* cited by examiner

*Primary Examiner* — Thinh T Nguyen
(74) *Attorney, Agent, or Firm* — Kilpatrick Townsend and Stockton LLP

(57) ABSTRACT

A method and structure for adding mass with stress isolation to MEMS. The structure has a thickness of silicon material coupled to at least one flexible element. The thickness of silicon material can be configured to move in one or more spatial directions about the flexible element(s) according to a specific embodiment. The apparatus also includes a plurality of recessed regions formed in respective spatial regions of the thickness of silicon material. Additionally, the apparatus includes a glue material within each of the recessed regions and a plug material formed overlying each of the recessed regions.

10 Claims, 8 Drawing Sheets

METHOD AND STRUCTURE FOR ADDING MASS WITH STRESS ISOLATION TO MEMS STRUCTURES

CROSS-REFERENCES TO RELATED APPLICATIONS

The present application claims priority to and incorporates by reference, for all purposes, the following pending patent application: U.S. Pat. App. No. 61/326,591, filed Apr. 21, 2010. The present invention also incorporates by reference, for all purposes, the following co-pending patent applications: U.S. patent application Ser. No. 12/859,672, filed Aug. 19, 2010, U.S. patent application Ser. No. 12/859,647, filed Aug. 19, 2010, U.S. patent application Ser. No. 12/490,067, filed Jun. 23, 2009, U.S. patent application Ser. No. 12/945,087, filed Nov. 12, 2010, and U.S. patent application Ser. No. 12/913,440, filed Oct. 27, 2010.

BACKGROUND OF THE INVENTION

The present invention relates generally to integrated devices. More particularly, the present invention provides a system and method for integrating micro electro-mechanical systems (MEMS) devices with other system applications configured on at least integrated electronic devices. More specifically, the present invention provides a method and structure for adding mass with stress isolation to MEMS structures. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS technology has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to integrated devices and systems are provided. More particularly, the present invention provides a system and method for integrating MEMS devices with other system applications configured on at least integrated electronic devices. More specifically, the present invention provides a method and structure for adding mass with stress isolation to MEMS. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

In a specific embodiment, the present invention provides an integrated silicon apparatus. The system has a thickness of silicon material coupled to one or more flexible elements. The thickness of silicon material can be configured to move in one or more spatial directions about the one or more flexible elements according to a specific embodiment. The apparatus also includes a plurality of recessed regions formed in respective spatial regions of the thickness of silicon material. Additionally, the apparatus includes a glue material within each of the recessed regions and a plug material formed overlying each of the recessed regions.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved MEMS device system and related applications for a variety of uses. In one or more embodiments, the present invention provides for rf MEMS and related applications, which may be integrated on one or more CMOS device structures. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow

DETAILED DESCRIPTION OF THE INVENTION

According to the present invention, techniques related generally to integrated devices and systems are provided. More particularly, the present invention provides a system and method for integrating MEMS devices with other system applications configured on at least integrated electronic devices. More specifically, the present invention provides a method and structure for adding mass with stress isolation to MEMS. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
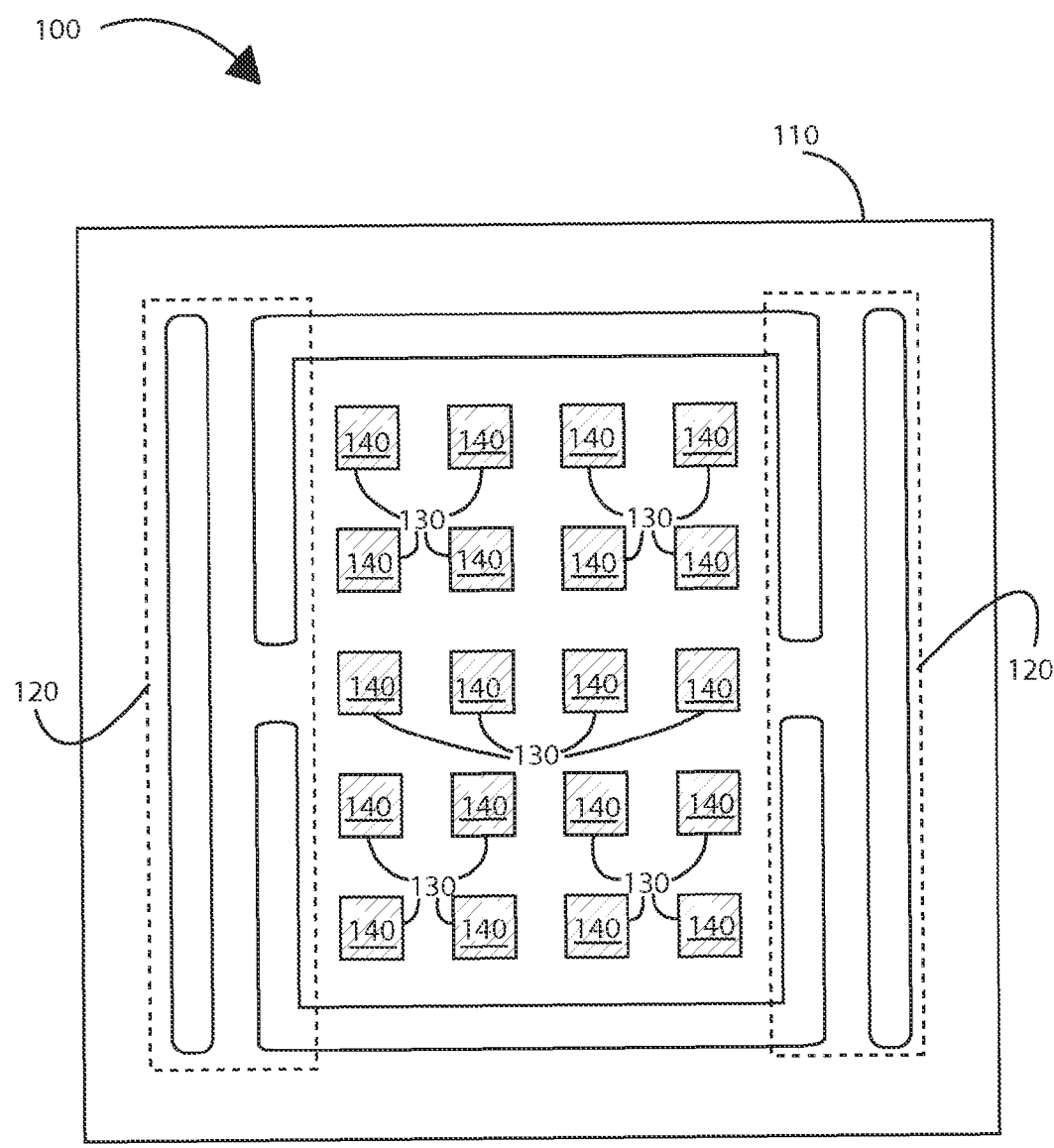
FIG. 1 is a simplified top system diagram of an integrated silicon apparatus according to an embodiment of the present invention.

FIG. 1 is a simplified top diagram of an integrated silicon apparatus according to an embodiment of the present invention. This diagram is merely an example, which should not unduly limit the scope of the claims herein. One of ordinary skill in the art would recognize other variations, modifications, and alternatives. As shown, apparatus 100 includes a thickness of silicon material 110, a plurality of recessed regions 120, a glue material 130, and a plug material 140. Those of ordinary skill in the art will recognize other variations, modifications, and alternatives.

In an embodiment, thickness of silicon material 110 can be coupled to at least one flexible element. Thickness of silicon material 110 can be configured to move in one or more spatial directions about the flexible element(s). In a specific embodiment, the thickness of silicon material can include monocrystalline silicon, polysilicon, or amorphous silicon. Additionally, the flexible element(s) can have a first dimension and a second dimension, as well as others. Those skilled in the art will recognize other variations, modifications, and alternatives.

In an embodiment, plurality of recessed regions 120 can be formed in respective spatial regions of thickness of silicon material 110. In a specific embodiment, plurality of recessed regions 120 can be configured as an array. In other embodiments, plurality of recessed regions 120 can be configured in other arrangements as well. Also, each of the recessed regions can be characterized by an aspect ratio of greater than five to one, but can be characterized by other aspect ratios as well. Of course, there can be other variations, modifications, and alternatives.

In an embodiment, glue material 130 can be provided within each of recessed regions 120 and plug material 140 can be formed overlying each of the recessed regions. In a specific embodiment, glue material 130 includes titanium metal, but can include other materials and combination of materials. In another specific embodiment, glue material 130 includes at least a titanium material, a platinum material, a cobalt material, a tantalum material, a tungsten material, or a nitride material. In an embodiment, glue material 130 can be used to bond plug material 140 within each of recessed regions 120. In a specific embodiment, plug material 140 includes a tungsten material, a silicon material, or another other material or combination thereof. As stated previously, there can be other variations, modifications, and alternatives.

In a specific embodiment, the thickness of silicon material 110 can comprise a proof mass configured from at least the plug material provided in each of the recessed regions. Additionally, the proof mass can be an inertial weight. Apparatus 100 can further include at least one stress isolation region configured within a vicinity of the flexible element(s). Furthermore, apparatus 100 can be provided on a large thickness of silicon material, or any other desirable material. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 2:
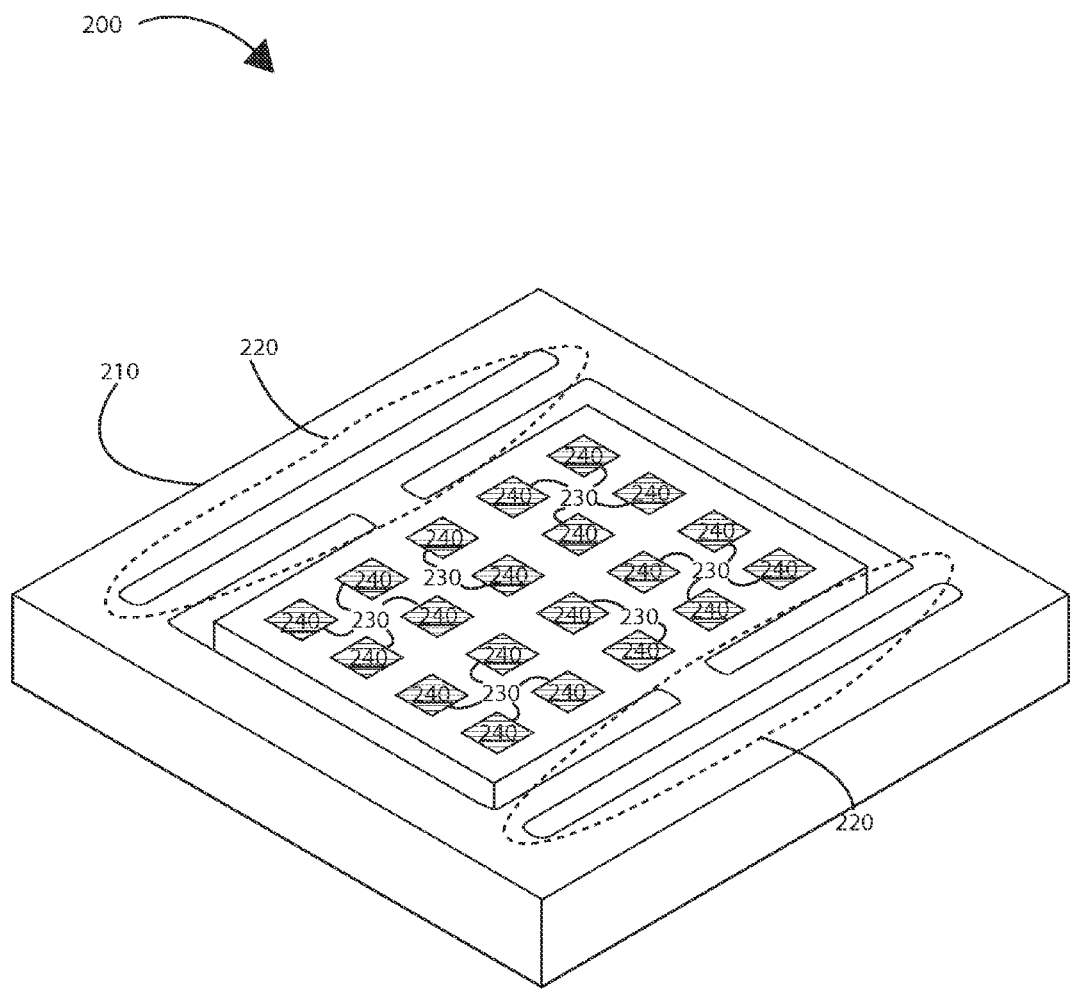
FIG. 2 is a simplified perspective diagram of an integrated silicon apparatus according to an embodiment of the present invention.

FIG. 2 is a simplified perspective diagram of an integrated silicon apparatus according to an embodiment of the present invention. This diagram is merely an example, which should not unduly limit the scope of the claims herein. One of ordinary skill in the art would recognize other variations, modifications, and alternatives. As shown, apparatus 200 includes a thickness of silicon material 210, a plurality of recessed regions 220, a glue material 230, and a plug material 240. Those of ordinary skill in the art will recognize other variations, modifications, and alternatives.

In an embodiment, thickness of silicon material 210 can be coupled to at least one flexible element. Thickness of silicon material 210 can be configured to move in one or more spatial directions about the flexible element(s). In a specific embodiment, the thickness of silicon material can include monocrystalline silicon, polysilicon, or amorphous silicon. Additionally, the flexible element(s) can have a first dimension and a second dimension, but can have others as well. Those skilled in the art will recognize other variations, modifications, and alternatives.

In an embodiment, plurality of recessed regions 220 can be formed in respective spatial regions of thickness of silicon material 210. In a specific embodiment, plurality of recessed regions 220 can be configured as an array. In other embodiments, plurality of recess regions 220 can be configured in other arrangements as well. Also, each of the recessed regions can be characterized by an aspect ratio of greater than five to one, but can be characterized by other aspect ratios as well. Of course, there can be other variations, modifications, and alternatives.

In an embodiment, glue material 230 can be provided within each of recessed regions 220 and plug material 240 can be formed overlying each of the recessed regions. In a specific embodiment, glue material 230 includes titanium metal, but can include other materials and combination of materials. In another specific embodiment, glue material 230 includes at least a titanium material, a platinum material, a cobalt material, a tantalum material, a tungsten material, or a nitride material. In an embodiment, glue material 230 can be used to bond plug material 240 within each of recessed regions 220. In a specific embodiment, plug material 240 includes a tungsten material, a silicon material, or another other material or combination thereof. As stated previously, there can be other variations, modifications, and alternatives.

In a specific embodiment, the thickness of silicon material 210 can comprise a proof mass configured from at least the plug material provided in each of the recessed regions. Additionally, the proof mass can be an inertial weight. Apparatus 200 can further include one or more stress isolation regions configured within a vicinity of the flexible element(s). Furthermore, apparatus 200 can be provided on a large thickness of silicon material, or any other desirable material. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
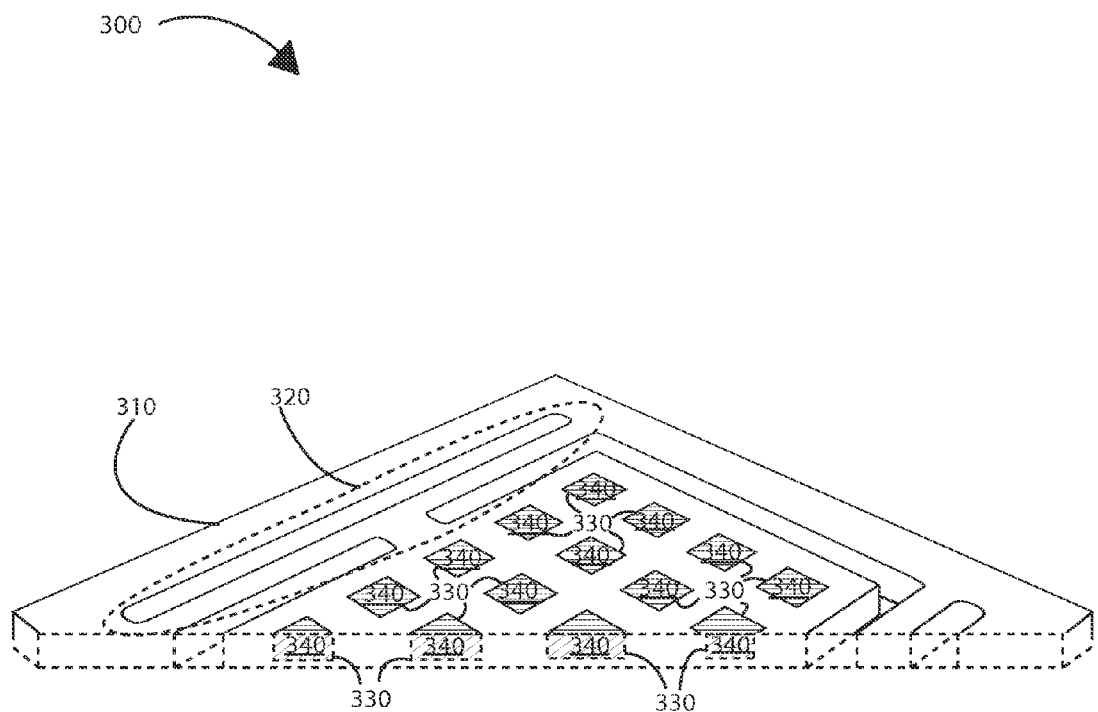
FIG. 3 is a simplified cross-sectional side diagram of an integrated silicon apparatus according to an embodiment of the present invention.

FIG. 3 is a simplified cross-sectional side diagram of an integrated silicon apparatus according to an embodiment of the present invention. This diagram is merely an example, which should not unduly limit the scope of the claims herein. One of ordinary skill in the art would recognize other variations, modifications, and alternatives. As shown, apparatus 300 includes a thickness of silicon material 310, a plurality of recessed regions 320, a glue material 330, and a plug material 340. Those of ordinary skill in the art will recognize other variations, modifications, and alternatives.

In an embodiment, thickness of silicon material 310 can be coupled to at least one flexible element. Thickness of silicon material 310 can be configured to move in one or more spatial directions about the flexible element(s). In a specific embodiment, the thickness of silicon material can include monocrystalline silicon, polysilicon, or amorphous silicon. Additionally, the flexible element(s) can have a first dimension and a second dimension, but can have others as well. Those skilled in the art will recognize other variations, modifications, and alternatives.

In an embodiment, plurality of recessed regions 320 can be formed in respective spatial regions of thickness of silicon material 310. In a specific embodiment, plurality of recessed regions 320 can be configured as an array. In other embodiments, plurality of recess regions 320 can be configured in other arrangements as well. Also, each of the recessed regions can be characterized by an aspect ratio of greater than five to one, but can be characterized by other aspect ratios as well. Of course, there can be other variations, modifications, and alternatives.

In an embodiment, glue material 330 can be provided within each of recessed regions 320 and plug material 340 can be formed overlying each of the recessed regions. In a specific embodiment, glue material 330 includes titanium metal, but can include other materials and combination of materials. In another specific embodiment, glue material 330 includes at least a titanium material, a platinum material, a cobalt material, a tantalum material, a tungsten material, or a nitride material. In an embodiment, glue material 330 can be used to bond plug material 340 within each of recessed regions 320. In a specific embodiment, plug material 340 includes a tungsten material, a silicon material, or another other material or combination thereof. As stated previously, there can be other variations, modifications, and alternatives.

In a specific embodiment, the thickness of silicon material 310 can comprise a proof mass configured from at least the plug material provided in each of the recessed regions. Additionally, the proof mass can be an inertial weight. Apparatus 300 can further include at least one stress isolation region configured within a vicinity of the flexible element(s). Furthermore, apparatus 300 can be provided on a large thickness of silicon material, or any other desirable material. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
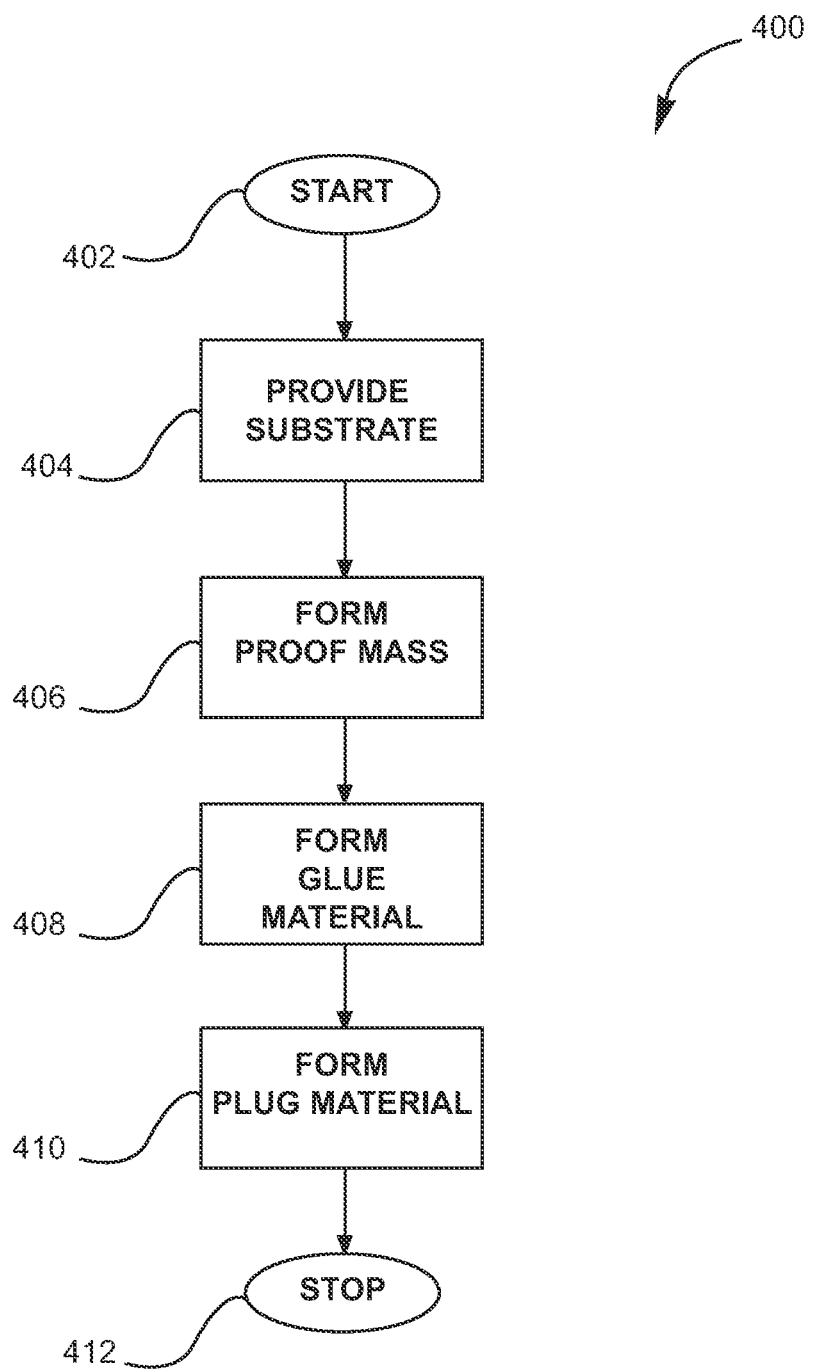
FIG. 4 is a simplified flow diagram illustrating a method of fabricating an integrated silicon apparatus according to an embodiment of the present invention.

FIG. 4 is a simplified flow diagram illustrating a method for fabricating an integrated silicon apparatus according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 4, the present method can be briefly outlined below.

1. Start;
2. Provide a substrate coupled to at least one flexible element;
3. Form a proof mass structure;
4. Form glue materials;
5. Form plug materials; and
6. Stop.

These steps are merely examples and should not unduly limit the scope of the claims herein. As shown, the above method provides a way of fabricating an integrated electronic device using edge bond pads according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 4, method 400 begins at start, step 402. The present method provides a fabrication method for forming an integrated silicon apparatus. Many benefits are achieved by way of the present invention over conventional techniques. For example, the present technique provides an easy to use process that relies upon conventional technology. In some embodiments, the method provides higher device yields in dice per wafer with the integrated approach. Additionally, the method provides a process and system that are compatible with conventional process technology without substantial modifications to conventional equipment and processes. Preferably, the invention provides for an improved integrated micro electro-mechanical systems and electronic devices and related methods for a variety of uses. Depending upon the embodiment, one or more of these benefits may be achieved. These and other benefits will be described in more throughout the present specification and more particularly below.

Following step 402, a thickness of silicon material can be coupled to at least one flexible element, step 404. The thickness of silicon material can be configured to move in one or more spatial directions about the flexible element(s). In a specific embodiment, the thickness of silicon material can include monocrystalline silicon, polysilicon, or amorphous silicon. Additionally, the flexible element(s) can have a first dimension and a second dimension, but can have others as well. Those skilled in the art will recognize other variations, modifications, and alternatives.

A plurality of recessed regions can be formed in respective spatial regions of thickness of silicon material to form a proof mass apparatus, step 406. In a specific embodiment, the plurality of recessed regions can be configured as an array. In other embodiments, the plurality of recess regions can be configured in other arrangements as well. Also, each of the recessed regions can be characterized by an aspect ratio of greater than five to one, but can be characterized by other aspect ratios as well. Of course, there can be other variations, modifications, and alternatives.

Then, a glue material can be formed within each of recessed regions, step 408 and a plug material can be formed overlying each of the recessed regions, step 410. In a specific embodiment, the glue material includes titanium metal, but can include other materials and combination of materials. In another specific embodiment, the glue materials include at least a titanium material, a platinum material, a cobalt material, a tantalum material, a tungsten material, or a nitride material. In an embodiment, the glue materials can be used to bond the plug materials within each of the recessed regions. In a specific embodiment, the plug materials include a tungsten material, a silicon material, or another other material or combination thereof. As stated previously, there can be other variations, modifications, and alternatives.

In a specific embodiment, the thickness of silicon material can comprise a proof mass configured from at least the plug material provided in each of the recessed regions. Additionally, the proof mass can be an inertial weight. The apparatus can further include at least one stress isolation region configured within a vicinity of the flexible element(s). Furthermore, the apparatus can be provided on a large thickness of silicon material, or any other desirable material. Of course, there can be other variations, modifications, and alternatives.

The above sequence of processes provides a fabrication method for forming an integrated silicon apparatus according to an embodiment of the present invention. As shown, the method uses a combination of steps including providing a substrate, forming a proof mass apparatus, forming glue materials, and forming plug materials. Other alternatives can also be provided where steps are added, one or more steps are removed, or one or more steps are provided in a different sequence without departing from the scope of the claims herein. Further details of the present method can be found throughout the present specification.

Figure 5:
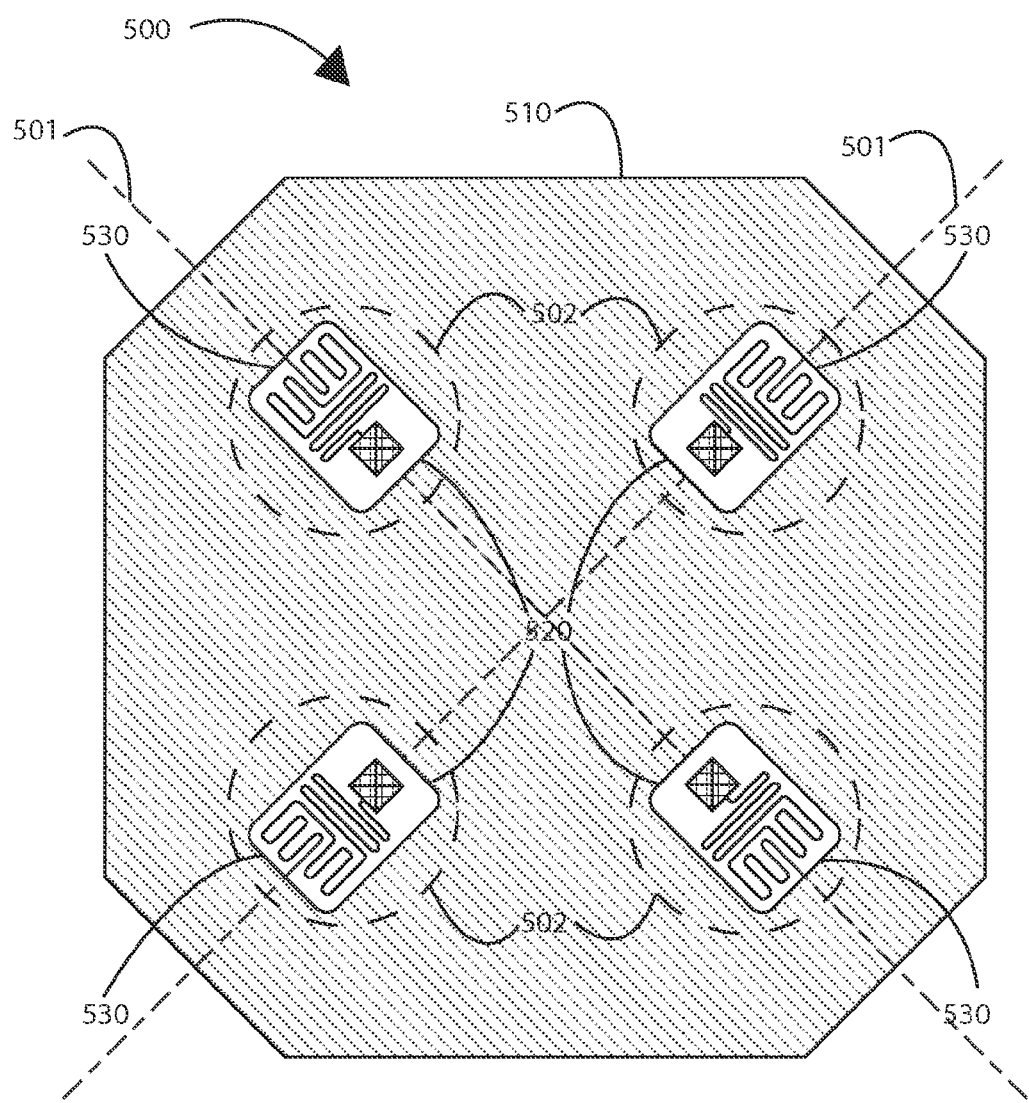
FIG. 5 is a simplified top diagram of a transducer apparatus according to an embodiment of the present invention.

FIG. 5 is a simplified top diagram of a transducer apparatus according to an embodiment of the present invention. As shown, apparatus 500 includes a movable base structure 510, at least one intermediate anchor structure 520, and at least one intermediate spring structure 530. In an embodiment, apparatus 500 can be configured to improve tolerance of external deformations. Those of ordinary skill in the art will recognize other variations, modifications, and alternatives.

In various embodiments, movable base structure 510 can have an outer surface region, and have at least one portion removed to form at least one inner surface region 502. In a specific embodiment, movable base structure 510 can be formed from a single crystal silicon, polycrystalline silicon, or amorphous silicon material. Moveable base structure 510 can also include a thickness of a polymer or a thickness of a metal material. In other embodiments, movable base structure 510 can include other materials and combinations thereof. In a specific embodiment, movable base structure 510 can be a rectangular movable base structure, a patterned polygonal base structure, or the like. Those skilled in the art will recognize other variations, modifications, and alternatives.

In various embodiments, intermediate anchor structure(s) 520 can be spatially disposed within a vicinity of inner surface region(s) 502 of the movable base structure. In a specific embodiment, intermediate anchor structure(s) 520 can be formed from single crystal silicon, polycrystalline silicon, amorphous silicon material, or the like. Intermediate anchor structure(s) 520 can also include a polymer or metal material, or other materials or combinations thereof. Of course, there can be other variations, modifications, and alternatives.

In an embodiment, intermediate spring structure(s) 530 can be operably coupled to the intermediate anchor structure (s) 520 and at least one portion of inner surface region(s) 502 of movable base structure 510. In a specific embodiment, intermediate spring structure(s) 530 can be formed from single crystal silicon, polycrystalline silicon, amorphous silicon material, or the like. Intermediate spring structure(s) 530 can also include a polymer or metal material, or other materials or combinations thereof. In a specific embodiment, intermediate spring structure(s) 530 can be spatially oriented to be substantially 45 degrees or substantially (pi/4) radians to the edges of the die. The intermediate spring structure(s) can have at least one segment having a segment length. To determine the orientation of a spring, the segments of the spring, which are connected by folds, are used as a reference. The segments would be positioned such that the segments are perpendicular to diagonal lines 501. Another way to determine the orientation of a spring can be done by drawing a "line" connecting the contacts of the spring from the anchor to the movable base (i.e. the end points of the spring). In this case, the proper orientation of the spring would have the "line" forming a substantially 45 degree or (pi/4) radian angle with the edges of a die (pointed along diagonal lines 101). Those skilled in the art will recognize other variations, modifications, and alternatives.

In an embodiment, apparatus 500 can include at least one capacitor element spatially disposed within a vicinity of inner surface region(s) 502 of movable base structure 510. The capacitor element(s) can include a fixed capacitor element and a movable capacitor element. The movable capacitor element will generally be disposed in a portion of the movable base structure 510. In a specific embodiment, the physical basis of apparatus 500 is to have the average displacement of the fixed capacitor element(s) match the average displacement of the movable capacitor element(s) in response to external deformations. Of course, there can be other variations, modifications, and alternatives.

In an embodiment, apparatus 500 can be coupled to another MEMS device or an electronic device. In a specific embodiment, apparatus 500 can be configured to be tolerant of external deformations. Apparatus 500 can be a transducer apparatus which reduces the area needed for anchors and springs and provides more area for other MEMS components. There can be other variations, modifications, and alternatives as well.

As die sizes and MEMS design areas shrink, a premium is placed on the area used for different components of MEMS devices. For example, the inventors believe that the design for a next generation MEMS accelerometer would benefit greatly from the ability to shrink a necessary transducer apparatus, a structure used to convert one form of energy to another. A limitation to this, however is that temperature compensation of these sorts of apparatuses require that the substrate strain field of the movable "proof mass" be "sampled" (i.e. by the spring anchors) at diverse enough locations to be able to compensate or balance the movement/strain of the fixed capacitor plates. In a specific embodiment, this balance can be accomplished with the use of only four springs and anchors that are spatially disposed within intermediate locations. This configuration can be optimized to balance the effect of strain moving the fixed capacitor elements.

Another desirable design aspect contemplated by the inventors is the reduction of the area used for springs. This can be achieved via two approaches. First, by having the springs oriented at substantially 45 degrees or substantially (pi/4) radians with respect to the edges of a die (i.e. aligned to diagonal lines 501), the Young's modulus is reduced and/or minimized with respect to orientation angle for single crystal silicon and standard silicon wafer crystal orientations. One way to determine the orientation of a spring can be done by using the segments of the spring, which are connected by folds, as a reference. The segments would be positioned such that the segments are perpendicular to diagonal lines 501. Another way to determine the orientation of a spring can be done by drawing a "line" connecting the contacts of the spring from the anchor to the movable base (i.e. the end points of the spring). In this case, the proper orientation of the spring would have the "line" forming a substantially 45 degree or (pi/4) radian angle with the edges of a die (pointed along diagonal lines 501). However, the orientations of the springs may only be approximately oriented at the suggested angles due to manufacturing tolerances (orientation angles may be less than or greater than 45 degrees or (pi/4) radians). Second, the number of spring segments, which are connected by folds, should be regulated as too many spring segments may cause the spring structure to be not stiff enough. In various embodiments, the spring stiffness varies inversely with the number of spring segments, but cubic with respect to the spring segment length:

spring constant, $k$ is proportional to $N_{spring}/[N_{segment}*(L^3)]$, where $N_{spring}$=# of springs, $N_{segment}$=# of segments per spring, and $L$=segment length.

However, the number of segments cannot be below a certain number, or the spring segment length will exceed the available die size, or make it impossible to put the anchor for the springs at the properly optimized "intermediate" locations to minimize undesirable variations of output with temperature. As shown, the spring configuration with variable number of spring segments and spring segment length in either of two perpendicular directions represents various embodiments of the present invention. In such embodiments, the area is reduced while keeping the anchor and attachment point to the movable mass along a diagonal center line.

Figure 6:
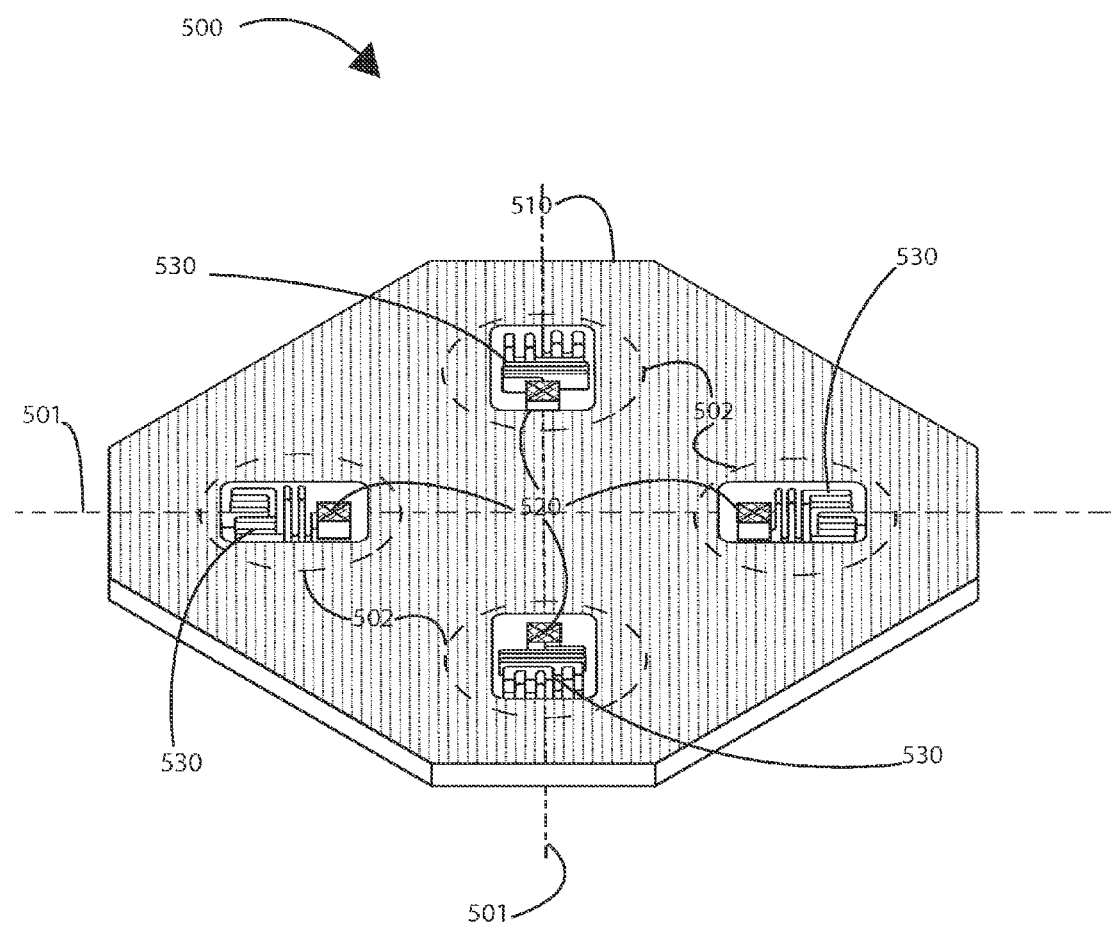
FIG. 6 is a simplified perspective diagram of a transducer apparatus according to an embodiment of the present invention.

FIG. 6 is a simplified perspective diagram of a transducer apparatus according to an embodiment of the present invention. As shown, apparatus 500 includes a movable base structure 510, at least one intermediate anchor structure 520, and at least one intermediate spring structure 530. In an embodiment, apparatus 500 can be configured to improve tolerance of external deformations. A detailed description regarding the elements and configuration of apparatus 500 can be found above in the description for FIG. 5. Those of ordinary skill in the art will recognize other variations, modifications, and alternatives.

Figure 7:
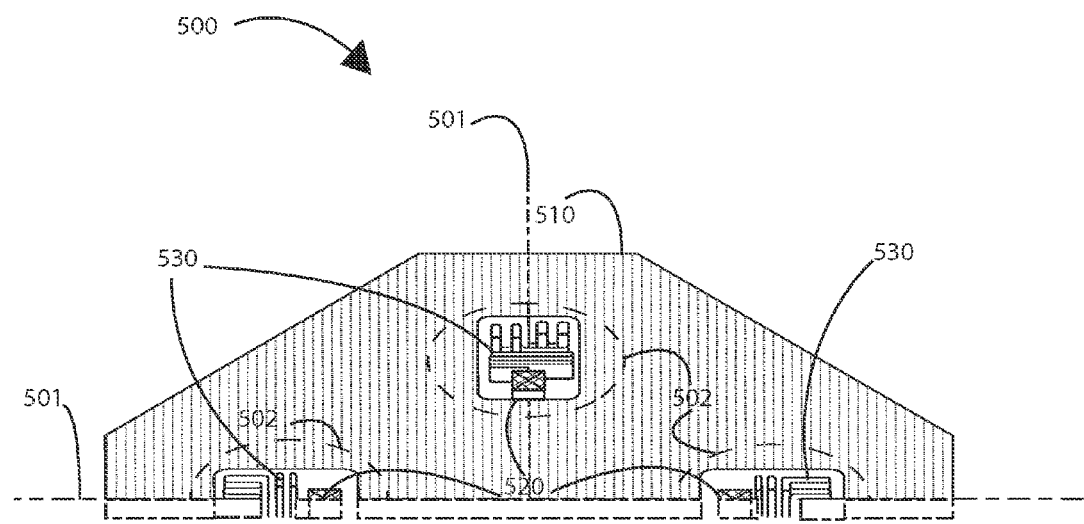
FIG. 7 is a simplified cross-sectional side diagram of a transducer apparatus according to an embodiment of the present invention.

FIG. 7 is a simplified cross-sectional side diagram of a transducer apparatus according to an embodiment of the present invention. As shown, apparatus 500 includes a movable base structure 510, at least one intermediate anchor structure 520, and at least one intermediate spring structure 530. In an embodiment, apparatus 500 can be configured to improve tolerance of external deformations. A detailed description regarding the elements and configuration of apparatus 500 can be found above in the description for FIG. 5. Those of ordinary skill in the art will recognize other variations, modifications, and alternatives.

Figure 8:
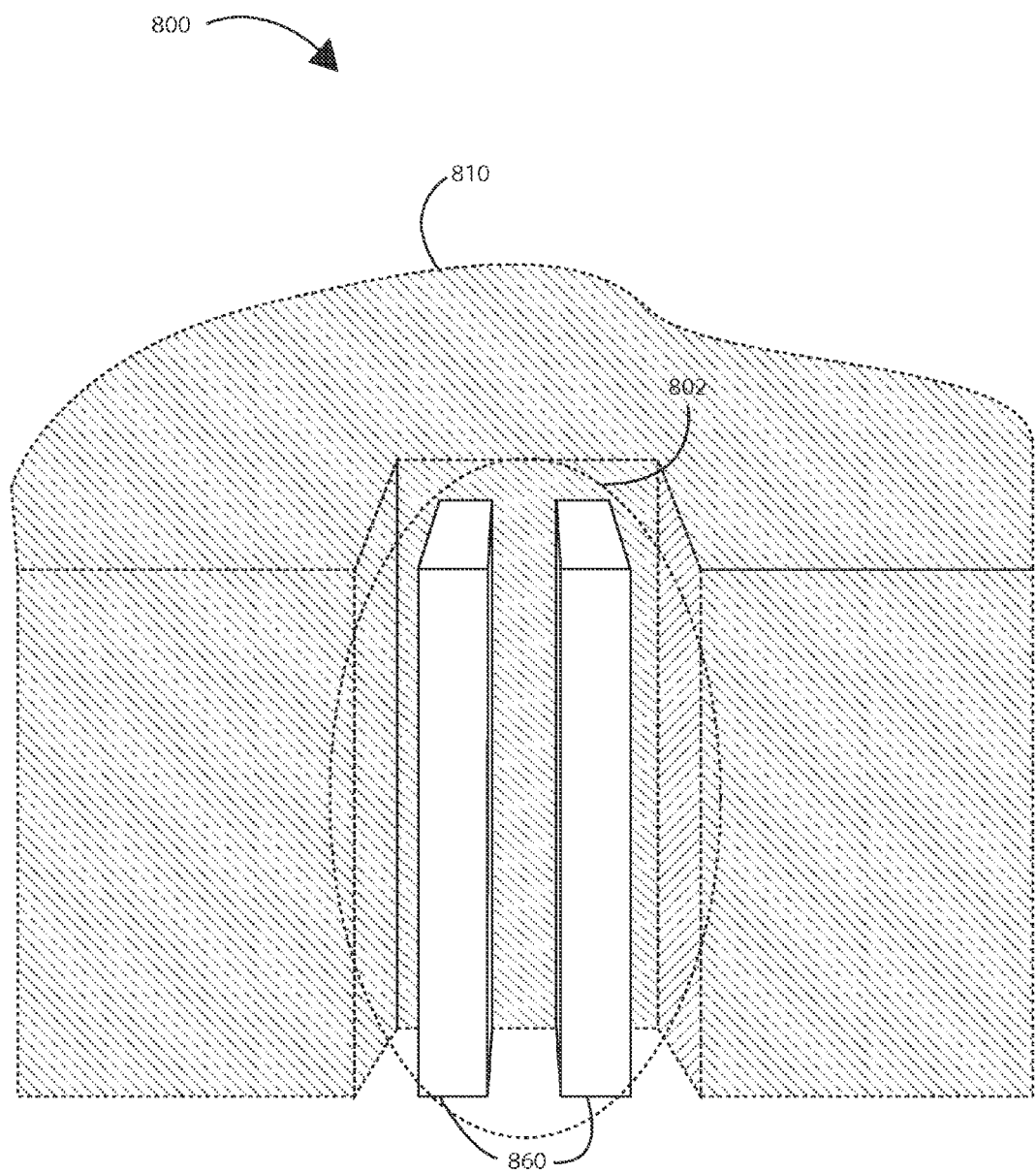
FIG. 8 is a simplified cross-sectional close-up diagram of a transducer apparatus according to an embodiment of the present invention.

FIG. 8 is a simplified cross-sectional close-up diagram of a transducer apparatus according to an embodiment of the present invention. As shown, apparatus 800 includes a movable base structure 810 and at least one capacitor element 860. In an embodiment, capacitor element(s) 860 can include a fixed capacitor element and a movable capacitor element. The movable capacitor element can be disposed on a portion of the movable base structure and the fixed capacitor element can be disposed on a portion of the anchor structure(s). The capacitor element(s) can be tall vertical structures, which can include silicon materials and the like. In an embodiment, apparatus 800 can be configured to improve tolerance of external deformations. Capacitor element(s) 860 can be spatially disposed within a vicinity of inner surface region(s) 802 of the movable base structure. Capacitor element(s) 860 can also include differential capacitor element pair(s). In a specific embodiment, the differential capacitor element pair(s) can operate during motion of movable base structure 810. The charge on one element of the pair can increase while the charge on the other complementary element can decrease. Each differential pair can also be spatially disposed within a vicinity of inner surface region(s) 802, and each pair can be disposed within a vicinity of its own inner surface region, isolated from other pairs. A detailed description regarding the elements and configuration of apparatus 400 can be found above in the description for FIG. 5. Those of ordinary skill in the art will recognize other variations, modifications, and alternatives.

What is claimed is:

1. An apparatus disposed upon a substrate having a surface region, the apparatus comprising:
   a thickness of silicon material coupled to at least one flexible element, the thickness of silicon material being configured to move in one or more spatial directions about the flexible element, the thickness of silicon material having at least one intermediate cavity having a cavity surface region, the at least one flexible element being coupled to at least one portion of the surface region and at least one portion of the cavity surface region, the at least one flexible element being spatially oriented to be substantially 45 degrees or substantially (pi/4) radians to the edges of a die;
   a plurality of recessed regions formed in respective spatial regions of the thickness of silicon material; and
   a plug material formed overlying each of the recessed regions.

2. The apparatus of claim 1 further comprising a glue material provided within each of the recessed regions.

3. The apparatus of claim 1 wherein the plurality of recessed regions are configured as an array.

4. The apparatus of claim 1 wherein each of the recessed regions is characterized by an aspect ratio of greater than five to one.

5. The apparatus of claim 1 wherein the glue material comprises a titanium nitride material.

6. The apparatus of claim 1 wherein the glue material includes at least a titanium material, a platinum material, a cobalt material, a tantalum material, a tungsten material, or a nitride material.

7. The apparatus of claim 1 wherein the plug material comprises a tungsten material.

8. The apparatus of claim 1 wherein the thickness of silicon material comprises a proof mass configured from at least the plug material provided in each of the recessed regions.

9. The apparatus of claim 1 further comprising at least one stress isolation region configured within a vicinity of the flexible element(s).

10. An apparatus disposed upon a substrate having a surface region, the apparatus comprising:
    at least one intermediate anchor structure;
    at least one intermediate spring structure coupled to the at least one intermediate anchor structure;
    a movable base having a thickness of silicon material coupled to the at least one intermediate spring structure, the thickness of silicon material being configured to move in one or more spatial directions about the intermediate spring structure(s), the movable base having at least one intermediate cavity disposed in an intermediate portion of the movable base, the at least one intermediate cavity having a cavity surface region;
    wherein the at least one intermediate anchor structure is disposed within the at least one intermediate cavity, the intermediate anchor structure(s) being coupled to at least one portion of the surface region;

wherein the at least one intermediate spring structure is coupled to at least one portion of the cavity surface region, the intermediate spring structure(s) being oriented to be substantially 45 degrees or substantially (pi/4) radians to the edges of a die;

a plurality of recessed regions formed in respective spatial regions of the thickness of silicon material of the movable base, the plurality of recessed regions being formed as an array;

a glue material provided within each of the recessed regions; and a plug material formed overlying each of the recessed regions; the plug material comprising a tungsten material.

* * * * *